US010608606B2

United States Patent
Lee et al.

(10) Patent No.: US 10,608,606 B2
(45) Date of Patent: Mar. 31, 2020

(54) POWER AMPLIFIER NOISE SUPPRESSION USING FEEDBACK

(71) Applicant: Skyworks Solutions, Inc., Woburn, MA (US)

(72) Inventors: Yong Hee Lee, Tustin, CA (US); William J. Domino, Yorba Linda, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 16/016,390

(22) Filed: Jun. 22, 2018

(65) Prior Publication Data

US 2019/0028078 A1   Jan. 24, 2019

Related U.S. Application Data

(60) Provisional application No. 62/524,225, filed on Jun. 23, 2017, provisional application No. 62/569,965, filed on Oct. 9, 2017.

(51) Int. Cl.

| H04B 1/04 | (2006.01) |
|---|---|
| H03G 3/30 | (2006.01) |
| H03F 3/24 | (2006.01) |
| H03F 3/19 | (2006.01) |
| H03G 5/24 | (2006.01) |

(52) U.S. Cl.
CPC ............ *H03G 3/3042* (2013.01); *H03F 3/19* (2013.01); *H03F 3/245* (2013.01); *H03G 5/24* (2013.01); *H04B 1/0475* (2013.01); *H03F 2200/129* (2013.01); *H03F 2200/171* (2013.01); *H03F 2200/372* (2013.01); *H03F 2200/451* (2013.01); *H03G 2201/103* (2013.01); *H03G 2201/307* (2013.01); *H04B 2001/0408* (2013.01); *H04B 2001/0416* (2013.01)

(58) Field of Classification Search
CPC .. H03G 3/3042; H03G 5/24; H03G 2201/103; H03G 2201/307; H03F 3/245; H03F 3/19; H03F 2200/171; H03F 2200/129; H03F 2200/372; H03F 2200/451; H04B 1/0475; H04B 2001/0416
See application file for complete search history.

(56) References Cited

U.S. PATENT DOCUMENTS

| 4,276,514 A * | 6/1981 | Huang ................ H03F 1/345 330/109 |
|---|---|---|
| 5,237,288 A * | 8/1993 | Cleveland ............ H03F 1/34 330/107 |
| 6,633,751 B1 | 10/2003 | Demgaard et al. |

(Continued)

*Primary Examiner* — Kenneth T Lam
(74) *Attorney, Agent, or Firm* — Knobbe, Martens, Olson & Bear LLP

(57) ABSTRACT

A power amplifier system can include a power amplifier that provides amplification to a radio frequency signal associated with a first frequency band and outputs an amplified radio frequency signal. An acoustic wave bandpass filter such as a surface acoustic wave or bulk acoustic wave bandpass filter is arranged in a feedback configuration with respect to the power amplifier. The filter can pass through a portion of the amplified radio frequency signal corresponding to a second frequency to provide negative feedback to the power amplifier, resulting in a reduction in an amount of gain from the power amplifier within the second frequency band.

21 Claims, 9 Drawing Sheets

(56) References Cited

U.S. PATENT DOCUMENTS

| | | | |
|---|---|---|---|
| 6,670,849 B1 | 12/2003 | Damgaard et al. | |
| 6,792,282 B1 | 9/2004 | Domino et al. | |
| 7,330,668 B2 * | 2/2008 | Heimlicher | H03F 1/26 250/214 A |
| 7,656,229 B2 * | 2/2010 | Deng | H03F 1/223 330/149 |
| 2001/0051504 A1 | 12/2001 | Kubo | |
| 2007/0082617 A1 | 4/2007 | McCallister | |
| 2008/0265996 A1 * | 10/2008 | Kim | H03F 1/3247 330/291 |
| 2011/0068658 A1 * | 3/2011 | Kamitani | F04D 27/00 310/316.01 |
| 2011/0156815 A1 * | 6/2011 | Kim | H03F 1/304 330/149 |
| 2012/0155572 A1 * | 6/2012 | Kim | H03F 1/3247 375/297 |
| 2019/0028064 A1 * | 1/2019 | Lee | H03F 1/26 |
| 2019/0028078 A1 | 1/2019 | Lee et al. | |

* cited by examiner

POWER AMPLIFIER NOISE SUPPRESSION USING FEEDBACK

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Field

Embodiments relate generally to power amplifier modules. More specifically, embodiments are directed to noise suppression for power amplifier modules.

Description of the Related Technology

Power amplifiers are used in many electronic devices to convert low power signals to higher power signals. For example, in a mobile device such as a mobile phone, a power amplifier may be used to amplified an RF signal to drive an antenna of a transceiver for transmitting wireless data.

It can be desirable in power amplifier systems to reduce undesired noise in certain frequency bands.

SUMMARY

Electronic devices that transmit an RF signal on a desired frequency band are typically required to minimize emissions into other "protected" frequency bands, for example the GPS band. Where such an electronic device includes a power amplifier, the unwanted emissions may be created by amplification of unwanted RF power originating from various sources and reaching the power amplifier input. These sources include thermal noise elevated by the noise figure of the power amplifier itself, noise conducted directly from any preceding stages that drive the power amplifier, and unwanted signals radiated or conducted from other systems or modules within the electronic device. It is desirable to minimize undesired emission in the protected band (e.g., GPS band) because it may interfere with and inhibit the operation associated with the protected band (e.g., inhibit operation of GPS receivers).

In certain embodiments, the present disclosure relates to a power amplifier system comprising a noise suppression feedback circuit. The present disclosure also relates to a wireless device containing a power amplifier system with a noise suppression feedback loop. The present disclosure also relates to a radio frequency module comprising a substrate having a power amplifier system with a noise suppression feedback loop.

In some embodiments, a power amplifier system is provided. The power amplifier system comprises a power amplifier configured to provide amplification to a radio frequency signal associated with a first frequency band and output an amplified radio frequency signal. The power amplifier system further comprises a feedback loop. The feedback loop includes a directional coupler configured to measure the amplified radio frequency signal. The feedback loop further includes a surface acoustic wave (SAW) bandpass filter configured to pass through a portion of the amplified radio frequency signal corresponding to a second frequency band. An output of the SAW bandpass filter is coupled to an input of the power amplifier to provide negative feedback to the power amplifier, such that an amount of gain from the power amplifier within the second frequency band is reduced.

In some embodiments, a power amplifier system is provided. The power amplifier system comprises a power amplifier configured to provide amplification to a radio frequency signal associated with a first frequency band and output an amplified radio frequency signal. The power amplifier system further comprises a feedback loop. The feedback loop comprises a directional coupler configured to measure the amplified radio frequency signal. The feedback loop further comprises a bandpass filter configured to pass through a portion of the amplified radio frequency signal corresponding to a second frequency band. The feedback loop further comprises a plurality of phase shifters comprising at least a first phase shifter coupled between the directional coupler and an input of the bandpass filter and a second phase shifter coupled to an output of the bandpass filter. A phase-shifted output of the bandpass filter provides negative feedback to the power amplifier, such that an amount of gain from the power amplifier within the second frequency band is reduced.

According to some aspects, the disclosure includes a power amplifier system comprising a power amplifier configured to provide amplification to a radio frequency signal associated with a first frequency band and output an amplified radio frequency signal. The system can further comprise an acoustic wave bandpass filter arranged in a feedback configuration with respect to the power amplifier. The acoustic wave bandpass filter can be configured to pass through a portion of the amplified radio frequency signal corresponding to a second frequency band to an input of the power amplifier to provide negative feedback to the power amplifier, resulting in a reduction in an amount of gain from the power amplifier within the second frequency band.

The first frequency band can correspond to a Long-Term Evolution mid-band frequency band. The acoustic wave bandpass filter can be a surface acoustic wave filter or a bulk acoustic wave filter. The second frequency band can correspond to a global positioning system frequency band.

The system can comprise a directional coupler positioned between an output of the power amplifier and an input of the acoustic wave bandpass filter. The system can comprise at least one phase shifter coupled between an output of the power amplifier and an input of the acoustic wave bandpass filter. The system can according to some embodiments comprise at least one phase shifter coupled between the output of the acoustic wave bandpass filter and an input of the power amplifier.

According to additional aspects, a wireless device comprises a transceiver configured to generate a radio frequency signal associated with a first frequency band. The device can also include a power amplifier configured to provide amplification to the radio frequency signal and output an amplified radio frequency signal. An acoustic wave bandpass filter can be arranged in a feedback configuration with respect to the power amplifier. The acoustic wave bandpass filter can be configured to pass through a portion of the amplified radio frequency signal corresponding to a second frequency band to an input of the power amplifier to provide negative feedback to the power amplifier, resulting in a reduction in an amount of gain from the power amplifier within the second frequency band.

The first frequency band can correspond to a Long-Term Evolution mid-band frequency band. The acoustic wave bandpass filter can a surface acoustic wave filter or a bulk acoustic wave filter. The the second frequency band can correspond to a GPS frequency band.

The device can further include a directional coupler positioned between an output of the power amplifier and an input of the acoustic wave bandpass filter.

At least one phase shifter can be coupled between an output of the power amplifier and an input of the acoustic wave bandpass filter. At least one phase shifter can be coupled between the output of the acoustic wave bandpass filter and an input of the power amplifier.

A packaged module according to yet further aspects comprises a package substrate and a power amplifier supported by the package substrate and configured to provide amplification to the radio frequency signal and output an amplified radio frequency signal. The module can further comprise an acoustic wave bandpass filter arranged in a feedback configuration with respect to the power amplifier, the acoustic wave bandpass filter configured to pass through a portion of the amplified radio frequency signal corresponding to a second frequency band to an input of the power amplifier to provide negative feedback to the power amplifier. This can result in a reduction in an amount of gain from the power amplifier within the second frequency band.

The first frequency band can correspond to a Long-Term Evolution mid-band frequency band. The second frequency band can correspond to a global positioning system frequency band.

The the acoustic wave bandpass filter can be a surface acoustic wave filter or a bulk acoustic wave filter.

The packaged module can further comprise a directional coupler positioned between an output of the power amplifier and an input of the acoustic wave bandpass filter. At least one phase shifter can be coupled between an output of the power amplifier and an input of the acoustic wave bandpass filter. At least one phase shifter can be coupled between the output of the acoustic wave bandpass filter and an input of the power amplifier.

A power amplifier system according to further aspects of the disclosure comprises a power amplifier configured to provide amplification to a radio frequency signal associated with a first frequency band and to output an amplified radio frequency signal. The system can comprise a bandpass filter arranged in a feedback loop with respect to the power amplifier and configured to pass through a portion of the amplified radio frequency signal corresponding to a second frequency band. A first phase shifter can be positioned in the feedback loop, an output of the feedback loop providing negative feedback to an input of the power amplifier.

The first phase shifter can be positioned between an output of the power amplifier and an input of the bandpass filter. A second phase shifter can be positioned between an output of the bandpass filter and the input to the power amplifier. The first phase shifter can be positioned between an output of the bandpass filter and the input to the power amplifier. A directional coupler can be included, and positioned between an output of the power amplifier and an input of the bandpass filter.

The bandpass filter may be a surface acoustic wave filter or a bulk acoustic wave filter.

The first frequency band can correspond to a Long-Term Evolution mid-band frequency band. The second frequency band can correspond to undesired noise. The second frequency band can correspond to a global positioning system frequency band.

According to additional aspects, a packaged module comprises a package substrate and a power amplifier supported by the package substrate, the power amplifier configured to provide amplification to a radio frequency signal associated with a first frequency band and output an amplified radio frequency signal. The module can further include a bandpass filter arranged in a feedback loop with respect to the power amplifier and configured to pass through a portion of the amplified radio frequency signal corresponding to a second frequency band. The module can also have a first phase shifter positioned in the feedback loop, an output of the feedback loop providing negative feedback to an input of the power amplifier.

The first phase shifter can be positioned between an output of the power amplifier and an input of the bandpass filter. A second phase shifter can be positioned between an output of the bandpass filter and the input to the power amplifier. The first phase shifter can be positioned between an output of the bandpass filter and the input to the power amplifier. A directional coupler can be positioned between an output of the power amplifier and an input of the bandpass filter.

The bandpass filter can be a surface acoustic wave filter or a bulk acoustic wave filter.

The first frequency band can correspond to a Long-Term Evolution mid-band frequency band. The second frequency band can correspond to undesired noise. The second frequency band can correspond to a global positioning system frequency band.

According to additional aspects a wireless device comprises a transceiver configured to generate a radio frequency signal associated with a first frequency band and a power amplifier configured to provide amplification to the radio frequency signal and output an amplified radio frequency signal. The device can also include a bandpass filter arranged in a feedback loop with respect to the power amplifier and configured to pass through a portion of the amplified radio frequency signal corresponding to a second frequency band. A first phase shifter can be positioned in the feedback loop, an output of the feedback loop providing negative feedback to an input of the power amplifier.

The first phase shifter can be positioned between an output of the power amplifier and an input of the bandpass filter. A second phase shifter can be positioned between an output of the bandpass filter and the input to the power amplifier. The first phase shifter can be positioned between an output of the bandpass filter and the input to the power amplifier. A directional coupler can be positioned between an output of the power amplifier and an input of the bandpass filter.

The bandpass filter can be a surface acoustic wave filter or a bulk acoustic wave filter.

The first frequency band can correspond to a Long-Term Evolution mid-band frequency band. The second frequency band can correspond to undesired noise. The second frequency band can correspond to a global positioning system frequency band.

DETAILED DESCRIPTION

The headings provided herein, if any, are for convenience only and do not necessarily affect the scope or meaning of the claimed invention.

Power amplifiers are used in many electronic devices to convert low power signals (e.g., low power radio frequency, or RF, signals) to higher power signals. For example, in a mobile device such as a mobile phone, one or more power amplifiers may be used to drive an antenna of a transceiver for transmitting wireless data.

Figure 1A:
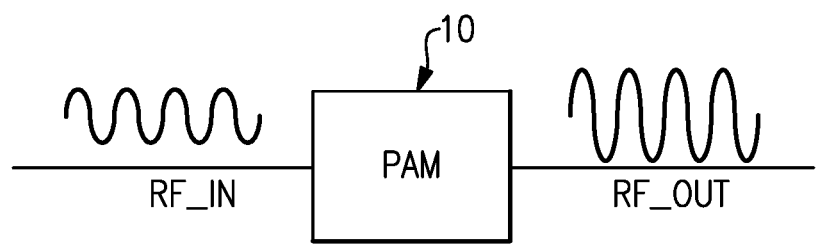
FIG. 1A is a schematic diagram of a power amplifier module for amplifying a radio frequency (RF) signal.

FIG. 1A is a schematic diagram of a power amplifier module (PAM) 10 for amplifying an RF signal. The illustrated power amplifier module 10 amplifies an RF signal (RF_IN) to generate an amplified RF signal (RF_OUT). In some embodiments, the amplified RF signal may be used to drive an antenna. The power amplifier module 10 can include one or more power amplifier circuits implemented using one or more features of the present disclosure.

In some embodiments, a power amplifier module may, in addition to amplifying a desired lower power signal, also amplify an undesired noise signal. Many electronic devices that transmit an RF signal on a desired frequency band are typically required to minimize emissions into other "protected" frequency bands, for example the GPS band. Where such an electronic device includes a power amplifier, the unwanted emissions may be created by amplification of unwanted RF power originating from various sources and reaching the power amplifier input. These sources include thermal noise elevated by the noise figure of the power amplifier itself, noise conducted directly from any preceding stages that drive the power amplifier, and unwanted signals radiated or conducted from other systems or modules within the electronic device. As such, the amplified RF signal may contain undesired noise in a frequency band corresponding to the GPS system. It is desirable to minimize this undesired emission in the protected band (e.g., GPS band) because it may interfere with and inhibit the operation of nearby receivers operating in the protected band (e.g., GPS receivers).

In some embodiments, the PAM 10 may be configured to suppress noise power from certain frequency bands (e.g., frequency bands associated with other systems/modules). For example, in some embodiments, the PAM 10 may be part of a Long-Term Evolution (LTE) system such as an LTE MB (mid-band) system associated with an operating frequency that is close to the frequency band of a GPS system. As such, the LTE MB PA module may need to be able to suppress noise associated with the GPS frequency band.

Figure 1B:
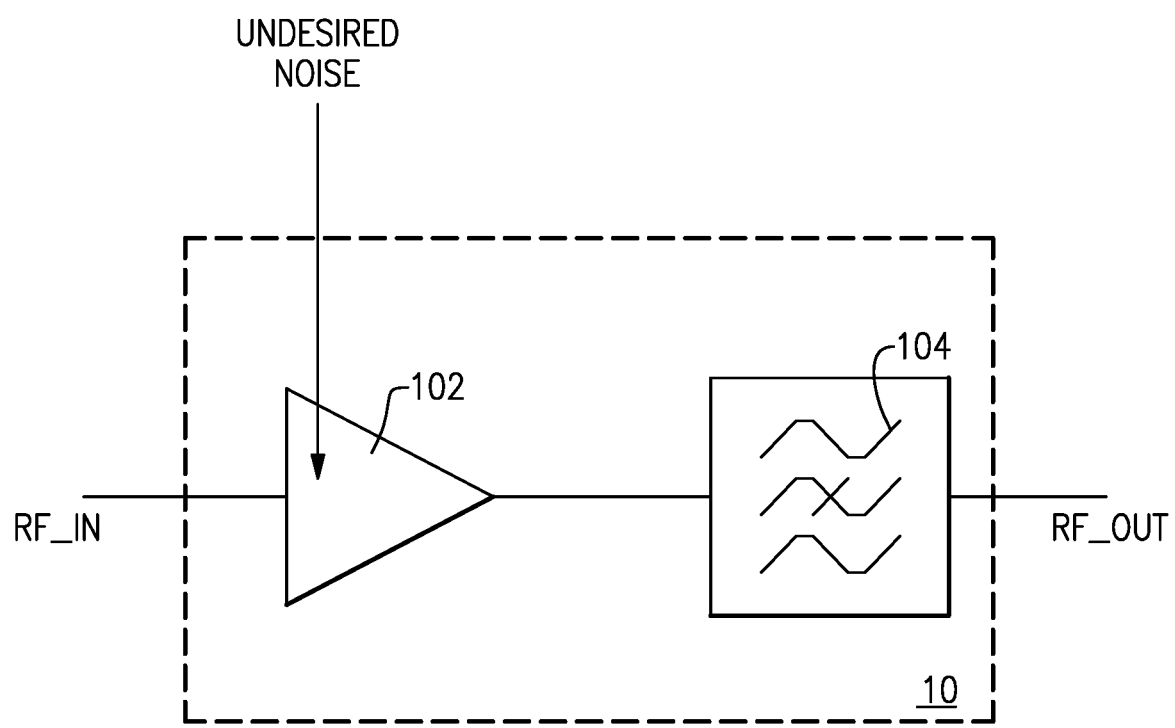
FIG. 1B is a schematic diagram of a portion of a power amplifier module for amplifying RF signals, while suppressing noise associated with the GPS frequency band using a band reject filter, in accordance with some embodiments.

FIG. 1B is a schematic diagram of a portion of the PAM 10 for amplifying RF signals, while suppressing noise associated with the GPS frequency band, in accordance with some embodiments. The PAM 10 may comprise a power amplifier circuit 102 that receives an input RF signal (e.g., RF_IN). In addition, the PAM 10 comprises a band rejection filter 104. The band rejection filter 104 may be configured to suppress signals within a certain frequency band (e.g., a frequency band corresponding to GPS band noise). In some embodiments, the band rejection filter 104 may be implemented as a surface acoustic wave (SAW) filter or a bulk acoustic wave (BAW) filter. It is understood that SAW or BAW band rejection filters may be implemented as a hybrid of LC elements (inductors, capacitors) and SAW/BAW resonators.

The power amplifier 102 amplifies the input RF signal to produce an output signal. The output signal may contain undesired noise (e.g., GPS noise) that has been amplified by the power amplifier 102. The output signal of the power amplifier 102 is passed through the band rejection filter 104 to form a filtered amplified signal (e.g., RF_OUT). Because the band reject filter 104 may be configured to filter or suppress signals within a frequency band associated with the undesired noise, the presence of undesired noise within the resulting amplified signal (e.g., RF_OUT) may be minimized. SAW and/or BAW rejection filters such as the filter 104 can be relatively costly, in part because they may be designed for handling relatively high power levels output by the power amplifier 102. Further, the insertion loss of a SAW or BAW filter placed directly following the power amplifier causes a loss of power and therefore a loss of power efficiency. Such loss may be of a magnitude from 1 dB up to several dB. For example a post-power-amplifier filter with 3 dB insertion loss would dissipate half of the RF power emitted by the power amplifier, in turn requiring a doubling of the output power of the power amplifier. Therefore it becomes desirable to provide a means of reducing noise in a protected band without the use of a post-power-amplifier filter. Certain embodiments provided herein (e.g., those shown in and described with respect to FIGS. 3 and 4A-6) address these and other challenges, and include power amplifier circuits having a feedback arrangement for achieving reduction of undesired noise.

Figure 2:
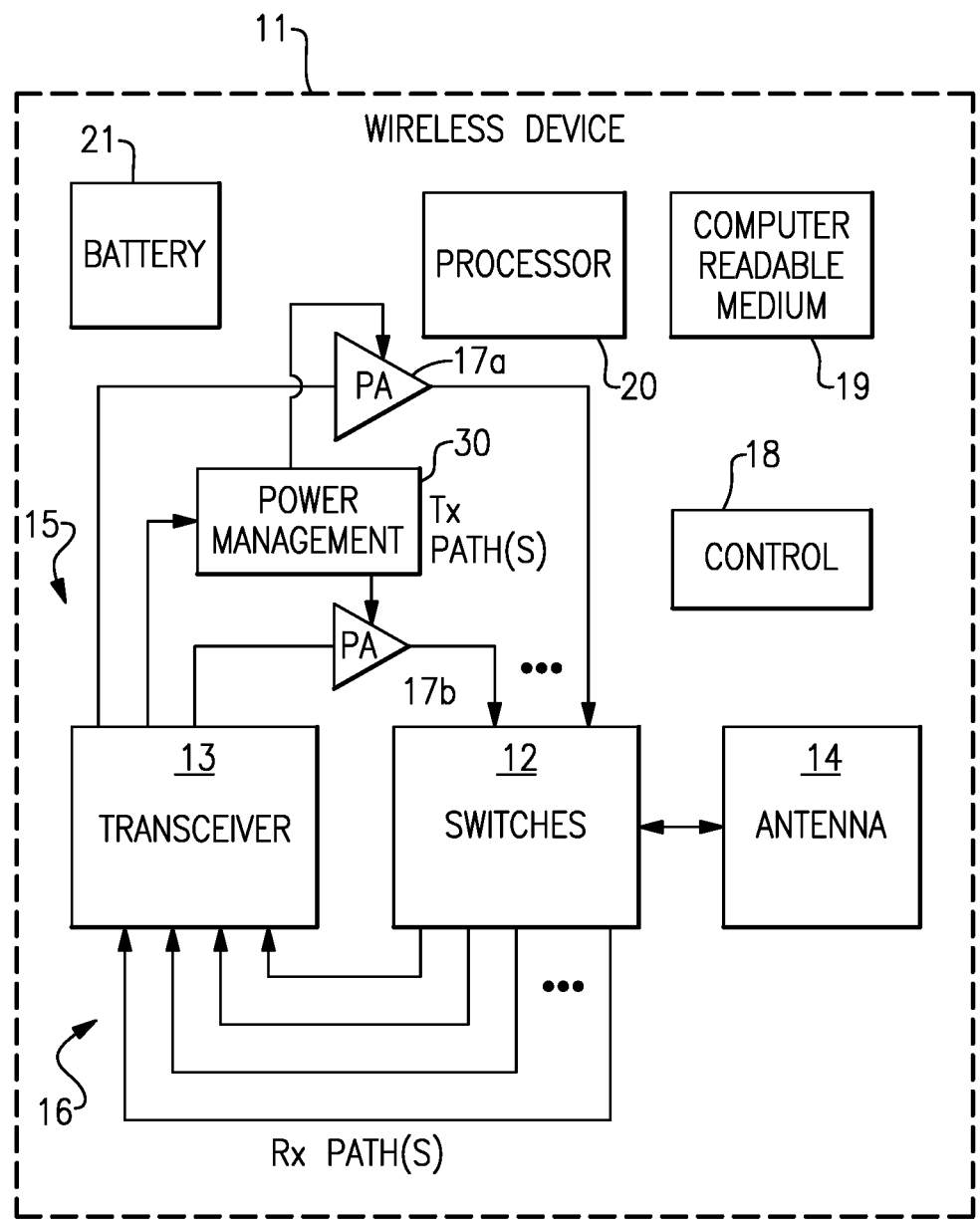
FIG. 2 is a schematic diagram of an example wireless device.

FIG. 2 is a schematic block diagram of an example wireless or mobile device 11. The wireless device 11 can include one or more power amplifier modules implemented using one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17a, 17b, a control component 18, a computer readable medium 19, a processor 20, a battery 21, and a power management system 30. In some embodiments, the power amplifiers 17a, 17b may be implemented as part of the PAM 10 illustrated in FIG. 1A, and may correspond to the power amplifier 102 illustrated in FIG. 1B.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas or a single antenna.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17a, 17b, the power management system 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the power management system 30, which can be used to provide power amplifier supply voltages to one or more of the power amplifiers 17a, 17b. For example, the power management system 30 can be configured to change the supply voltages provided to the power amplifiers 17a, 17b to improve efficiency, such as power added efficiency (PAE). The power management system 30 can be used to provide average power tracking (APT) and/or envelope tracking (ET). In some embodiments, the power management system 30 can include one or more LDO regulators used to generate power amplifier supply voltages for one or more stages of the power amplifiers 17a, 17b. In the illustrated implementation, the power management system 30 is controlled using a power control signal generated by the transceiver 13. In certain configurations, the power control signal is provided by the transceiver 13 to the power management system 30 over an interface, such as a serial peripheral interface (SPI) or Mobile Industry Processor Interface (MIPI). The wireless device 11 can include power amplifier circuits having a feedback arrangement for reduction of undesired noise, such as any of the circuits described herein. For instance, one or both of the power amplifiers 17a, 17b can be any of the power amplifier circuits shown in and described with respect to FIGS. 3 and 4A-6) below.

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Power Amplifier Feedback Circuit

As discussed above, in some embodiments, in order to suppress noise in certain (e.g., protected) frequency bands, a power amplifier 102 may be coupled to a band reject filter 104 configured to filter or suppress undesired signal in a protected frequency band. In some embodiments, the power amplifier 102 coupled to the band reject filter 104 may correspond to the power amplifiers 17a or 17b illustrated in FIG. 2.

However, in some embodiments, because the band reject filter 104 receives the direct output of the power amplifier 102, the band reject filter 104 may be required to have high power capacity and low loss at the desired transmission frequency (e.g., the frequency band associated with LTE MB channel). Band reject filters meeting these requirements may be uncommon or not commercial available.

In some embodiments, instead of using a band reject filter 104 directly coupled to the output of a power amplifier 102, the PAM 10 may implement a band pass filter as part of a feedback loop for the power amplifier 102, in order to suppress noise emission in a particular protected band (e.g., GPS band noise). This type of implementation in which noise reduction is achieved via a feedback arrangement may hereinafter be referred to as a power amplifier feedback circuit (PA feedback circuit) or feedback-arranged PA circuit.

Figure 3:
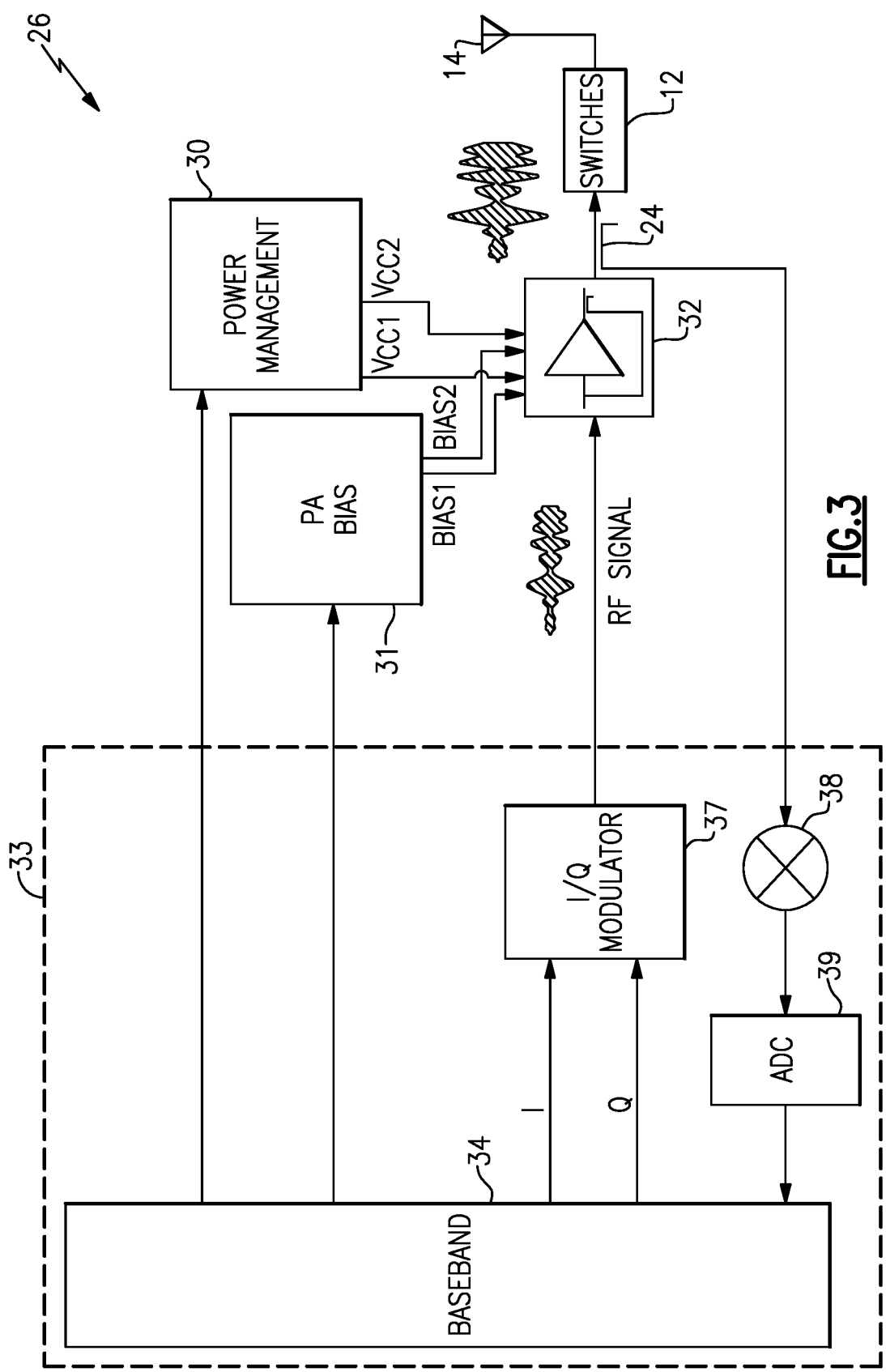
FIG. 3 is a schematic diagram of one embodiment of a power amplifier system.

FIG. 3 is a schematic block diagram of one example of a system 26, which can include a portion of the wireless device 11 shown in FIG. 2. The illustrated system 26 includes the switches 12, the antenna 14, a directional coupler 24, a power management system 30, a power amplifier bias circuit 31, a feedback-arranged PA circuit 32, and a transceiver 33 (which may correspond to the transceiver 13 as illustrated in FIG. 2). The illustrated transceiver 33 includes a baseband processor 34, a transmit digital-to-analog I/Q converter 40 which outputs a pair of transmit I and Q lines to an I/Q modulator 37. The transceiver 33 further includes a mixer 38, and a receive analog-to-digital I/Q converter (ADC) 39, which outputs a pair of receive I and Q lines to the baseband processor 34. Although not illustrated in FIG. 3 for clarity, the transceiver 33 can include circuitry associated with receiving signals over one or more receive paths.

In some embodiments, the feedback-arranged PA circuit 32 may be implemented as part of the PAM 10 illustrated in FIG. 1A. In some embodiments, the feedback-arranged PA 32 may comprise at least one power amplifier (e.g., power amplifier 102, 17a, and/or 17b) and a feedback loop having at least one band pass filter. Embodiments of the feedback-arranged PA 32 are described in greater detail below with regards to FIGS. 4A-4D.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the feedback-arranged PA 32. In certain implementations, the I/Q modulator 37 can include one or more filters configured to filter frequency content of signals processed therein.

The power amplifier bias circuit 31 receives a bias control signal from the transceiver 33, and generates one or more bias signals for the feedback-arranged PA 32. In the illustrated configuration, the power amplifier bias circuit 31 generates a first bias signal BIAS1 for biasing a driver stage of the power amplifier 32 and a second bias signal BIAS2 for biasing an output stage of the power amplifier 32. The bias signals BIAS1, BIAS2 can include current and/or voltage signals, and can be used, for example, to bias bases of bipolar transistors and/or gates of field-effect transistors associated with the power amplifier's stages. In certain configurations, the transceiver 33 can control the bias signals generated by the power amplifier bias circuit 31 to enhance the PAE of the power amplifier system 26. In one embodiment, the transceiver 33 controls each of the first and second bias signals BIAS1, BIAS2 to one of a multiple settings based on at least one of a frequency band of operation or a power mode (for example, high power mode, medium power mode, or low power mode).

The feedback-arranged PA 32 can receive the RF signal from the I/Q modulator 37 of the transceiver 33, and when enabled can provide an amplified RF signal to the antenna 14 via the switches 12. The directional coupler 24 can be positioned between the output of the feedback-arranged PA 32 and the input of the switches 12, and couples the signal output from the feedback arranged PA 32 to the transceiver 33 (via the mixer 38 and ADC 39), thereby allowing an output power measurement of the power amplifier 32 that does not include insertion loss of the switches 12. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the feedback-arranged PA 32 and the baseband processor 34, the baseband processor 34 can be configured to dynamically adjust the I and Q signals to optimize the operation of the power amplifier system 26. For example, configuring the power amplifier system 26 in this manner can aid in controlling the PAE and/or linearity of the power amplifier 32. However, other configurations of power control can be used. For example, mixer 38 and ADC 39 could be replaced by a simple wideband power detector used for power control only but not dynamic IQ signal adjustment.

The power management system 30 receives a power control signal from the transceiver 33, and generates one or more power amplifier supply voltages for the feedback-arranged PA 32. In the illustrated configuration, the power management system 30 generates a first power amplifier supply voltage $V_{CC1}$ for powering a driver stage of the power amplifier 32 and a second power amplifier supply voltage $V_{CC2}$ for powering an output stage of the feedback-arranged PA 32. In certain configurations, the transceiver 33 can control the voltage levels of the power amplifier supply voltages $V_{CC1}$, $V_{CC2}$ to enhance the power amplifier system's PAE. Embodiments of the power management system 30 are described in U.S. patent application Ser. No. 15/219,915, filed on Jul. 26, 2016, which is hereby incorporated by reference in its entirety.

Figure 4A:
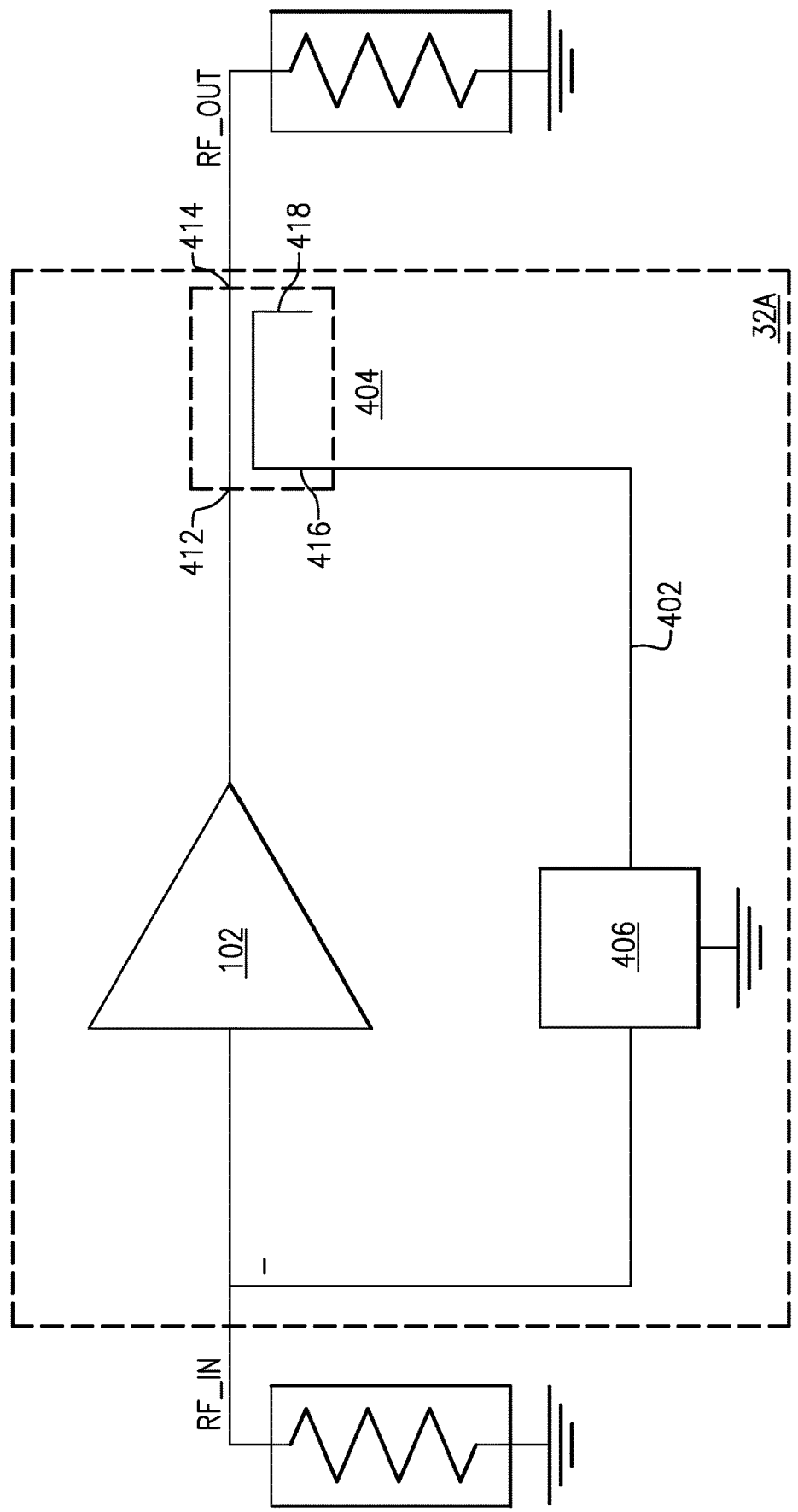
FIGS. 4A to 4D are schematic diagrams of power amplifier feedback circuits, in accordance with some embodiments.

FIG. 4A is a schematic diagram of a feedback-arranged PA 32a, in accordance with some embodiments. The feedback-arranged PA 32*a* may correspond to the feedback-arranged PA 32 as illustrated in FIG. 3.

As illustrated in FIG. 4A, the feedback-arranged PA 32*a* comprises the power amplifier 102 configured to amplify an input signal (e.g., RF_IN) to produce an amplified output signal (e.g., RF_OUT). In addition, instead of using a band reject filter as illustrated in FIG. 1B, the feedback-arranged PA 32*a* comprises a feedback loop 402 configured to reduce an amount of noise from certain (e.g., protected) frequency bands (e.g., noise from GPS frequency bands). In some embodiments, the feedback loop 402 comprises a directional coupler 404 coupled to the output of the power amplifier 102, and a band pass filter 406. Referring again to FIG. 3, while in the illustrated configurations the coupler 24 (FIG. 3) and the coupler 404 (FIGS. 4A-4D) are shown as two separate couplers, in some embodiments the functions of the coupler 24 (FIG. 3) and the coupler 404 (FIGS. 4A-4D) performed by a single physical coupler with its output split into two outputs as appropriate.

The input signal (e.g., RF_IN) amplified by the power amplifier 102 may be associated with a particular frequency band. However, the power amplifier 102 may also amplify noise from a certain (e.g., protected) frequency band (e.g., GPS frequency band), which may form a portion of the output of the power amplifier 102 (e.g., RF_OUT). The feedback loop 402 may be configured to reduce an overall gain from the power amplifier 102 at the protected frequency band, such that an amount of noise at the protected frequency band in the output signal is reduced.

The directional coupler 404 may be similar to the directional coupler 24 illustrated in FIG. 3, and allows for creation of the feedback loop 402 by coupling the signal output by the power amplifier 102 to the band pass filter 406. The output signal from the directional coupler 404 is provided to the band pass filter 406. The illustrated coupler 404 has an input port 412, a transmit port 414, a coupled port 416, and an isolated port 418. As shown, the input port 412 is coupled to the output of the power amplifier 102. The coupler 404 transmits power received from the power amplifier 102 on the input port 412 to the transmit port 414. The transmit port 414 delivers the transmitted power amplifier signal to an antenna switch module or other downstream component. The output power transmitted to the transmit port 414 can be a reduced version of the input power amplifier signal received by the coupler 404, where the transmitted power is reduced by the insertion loss of the coupler 404. The coupler 404 also transmits a portion of the input power amplifier signal received on the input port 412 to the coupled port 416. For instance, the power delivered to the coupled port 416 may be a version of the input power that is reduced according to a coupling factor of the coupler 404.

In some embodiments, the band pass filter (BPF) 406 is configured pass through signals within the protected frequency band (e.g., GPS frequency band), and to suppress signals that are outside the protected frequency band. As such, the BPF 406 will pass through the portion of the output signal from the power amplifier 102 (e.g., as coupled into the feedback loop 402 through the directional coupler 404) corresponding to undesired noise, while suppressing the portion of the output signal that corresponds to other frequency bands, including that of the desired frequency band (e.g., LTE MB frequencies). As such, the output of the BPF 406 may comprise only the portion of the output signal corresponding to the frequency band of the undesired noise. In some embodiments, the BPF 406 may be implemented as a SAW or a BAW filter. In some embodiments, because it is not directly connected to the output of the power amplifier 102, the BPF 406 may not need to be able to support high power handling, unlike the band reject filter 104 illustrated in FIG. 1B.

The output of the BPF 406 may be fed back to the input of the power amplifier 102 as part of a negative feedback loop. In the illustrated embodiment cancellation of the input signal at the input of the amplifier 102 will occur if the loop gain (amplifier gain plus feedback-path gain) is substantially unity (i.e. 0 dB) and the loop phase (amplifier phase shift plus feedback-path phase shift) is substantially 180 degrees. In FIG. 4A it is assumed that the blocks are already designed to accomplish this. In one example, amplifier 102 may be an inverting amplifier, thus providing the 180 degree phase shift, while coupler 404 and BPF 406 together provide no phase shift and just enough loss to cancel the gain of the amplifier 102. As a result, overall gain from the power amplifier 102 at the protected band is reduced, reducing the output signal strength at the protected frequency band, and therefore reducing undesired noise in the protected band.

On the other hand, because the BPF 406 does not pass through signals associated with frequencies outside the protected frequency band, the feedback loop 402 will provide minimal or no feedback to the input of the power amplifier 102 at those frequencies. As such, for frequencies outside the protected frequency band, the gain from the power amplifier 102 will remain substantially unaffected by the feedback loop 402.

Figure 4B:
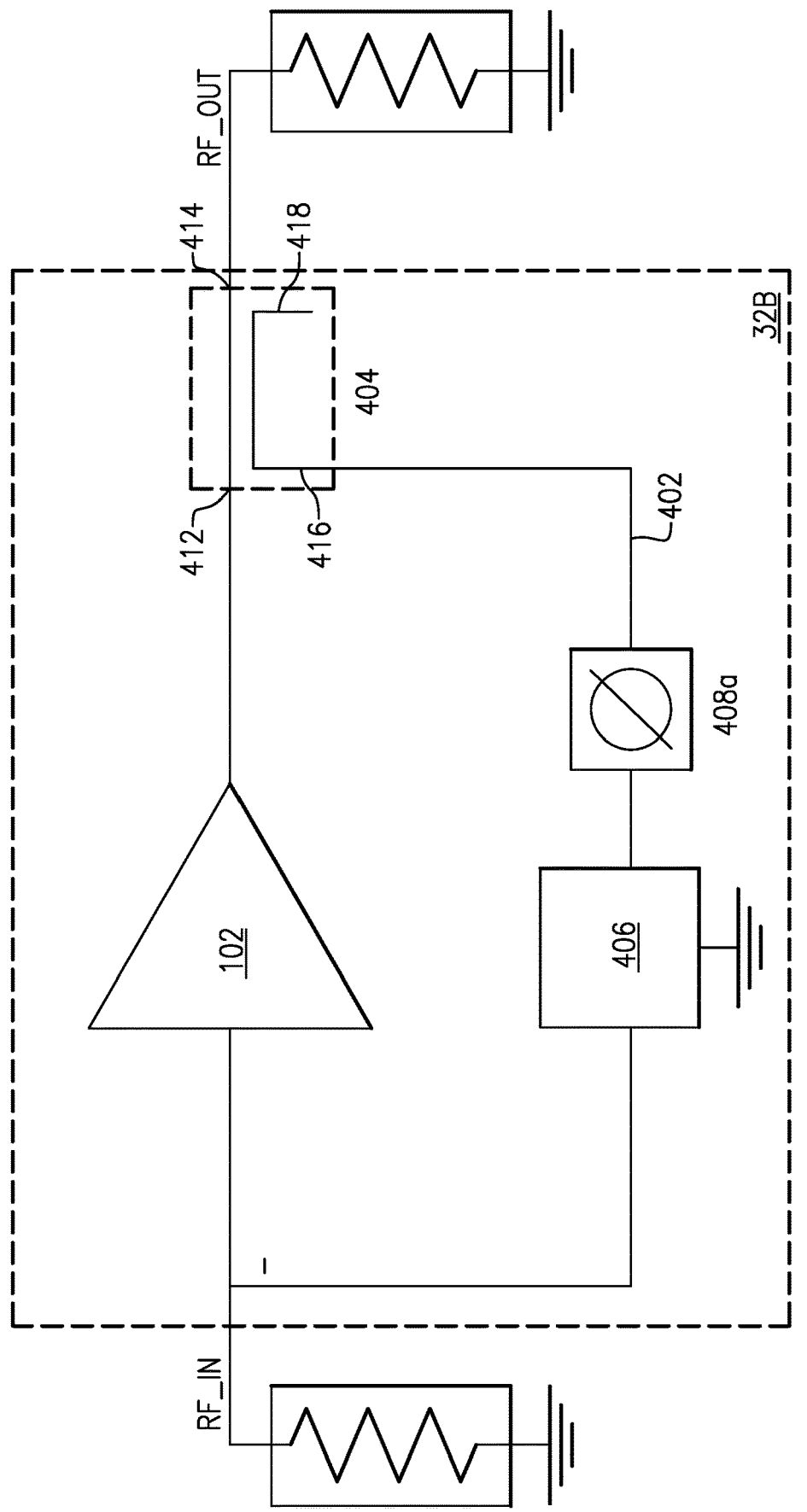

FIG. 4B is a schematic diagram of a feedback-arranged PA 32*b* for suppressing undesired noise from certain frequency bands (e.g., protected bands), in accordance with some embodiments, the feedback-arranged PA 32*b* is similar to the feedback-arranged PA 32*a* illustrated in FIG. 4A, and further comprises a phase shifter 408*a* coupled between the directional coupler 404 and the BPF 406. In some embodiments, the phase shifter 408*a* is configured to shift a phase of the output signal of the directional coupler 404 (e.g., which couples the output of the power amplifier 402 into the feedback loop 402) to be input to the BPF 406. Phase shifter 408*a* is adjusted until the loop phase (amplifier phase shift plus feedback-path phase shift) is substantially 180 degrees at the undesired frequencies (e.g., those corresponding to a GPS or other protected band), resulting in signal cancellation at the undesired frequencies at the amplifier input node.

Figure 4C:
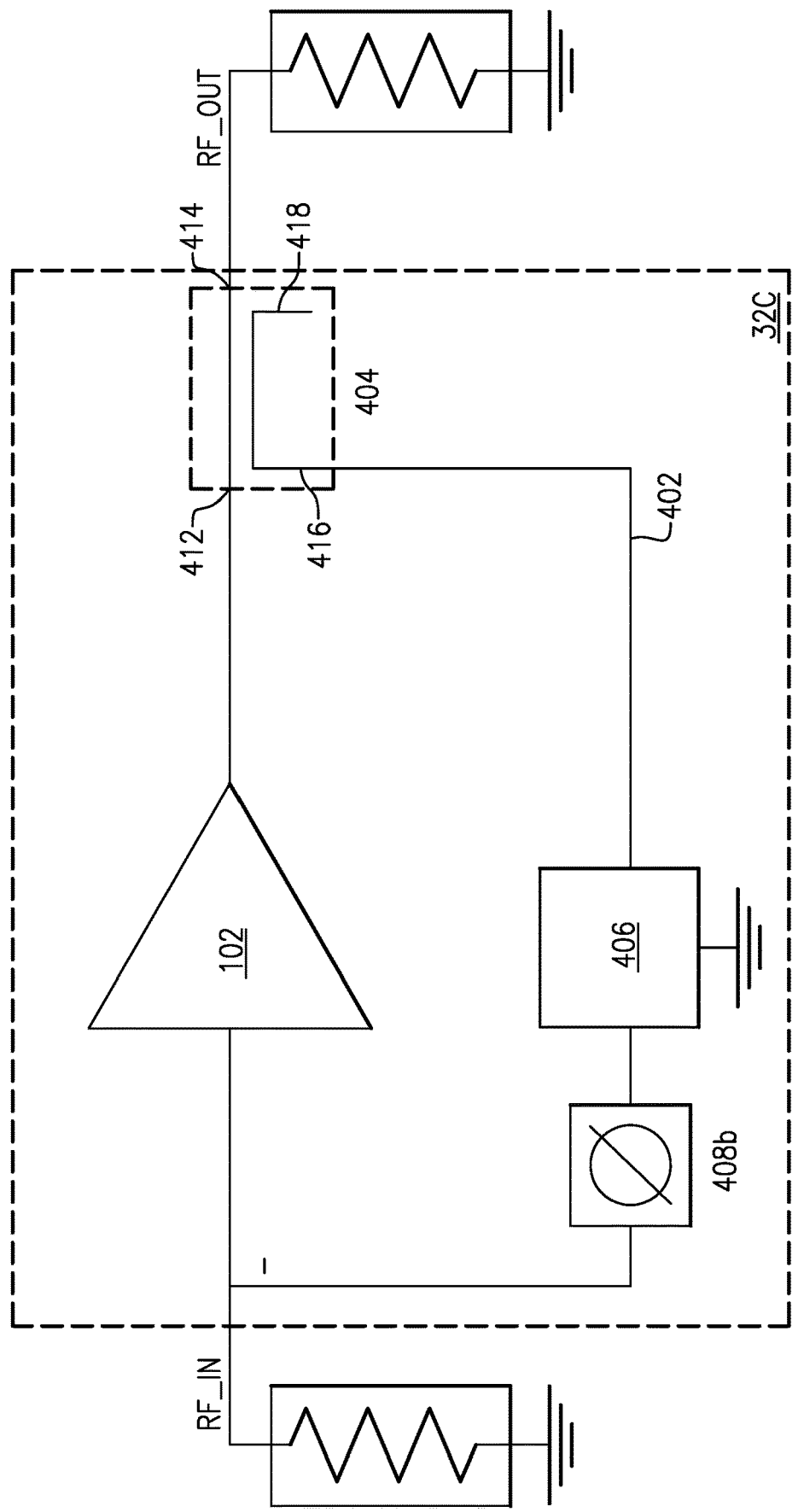

FIG. 4C is a schematic diagram of a feedback-arranged PA 32*c* for suppressing undesired noise from certain frequency bands (e.g., a GPS or other protected band), in accordance with some embodiments, the feedback-arranged PA 32*c* is similar to the feedback-arranged PA 32*a* illustrated in FIG. 4A, and further comprises a phase shifter 408*b* coupled between the output of the BPF 406 and the input of the power amplifier 102. As such, the phase shifter 408*b* may be configured to phase shift an output of the BPF 406 to be fed back to the input of the power amplifier 102. To maximize the gain of system 32C at the desired frequencies, the amplifier 102 should be allowed to operate at the desired frequencies as if the feedback path were disconnected from its input, that is, (1) substantially no feedback signal passes though BPF 406, and (2) a very high impedance is presented by BPF 406 to the amplifier input node to avoid loading it down and to avoid creating a leakage path by which some of the desired input signal power would be lost. Condition (1) has been discussed previously. Condition (2) is accomplished by the addition of phase shifter 408*b*. The desired frequency band will reside somewhere in the stopband of BPF 406, and depending on the design of BPF 406, the output impedance of BPF 406 in the desired frequency band may be very high or very low compared to a matched impedance. For example, in a 50 ohm system, the stopband impedance of BPF 406 may be a few ohms, or a few hundred ohms. Phase shifter 408b is placed between the output of BPF 406 and the input node of amplifier 102. Adjustment of phase shifter 408b effectively rotates the output impedance of BPF 406. The adjustment is made such that the impedance presented to the input node of amplifier 102 is maximized at the desired frequency band. While one purpose of phase shifter 408b is to rotate impedance in the desired band as just described, the phase shifter 408b also shifts the signal phase of the feedback signal at the undesired frequencies that pass through BPF 406. It is not likely that one phase shift setting on phase shifter 408b will simultaneously provide both the maximum impedance in the desired frequency band and the best signal cancellation in the undesired frequency band.

Figure 4D:
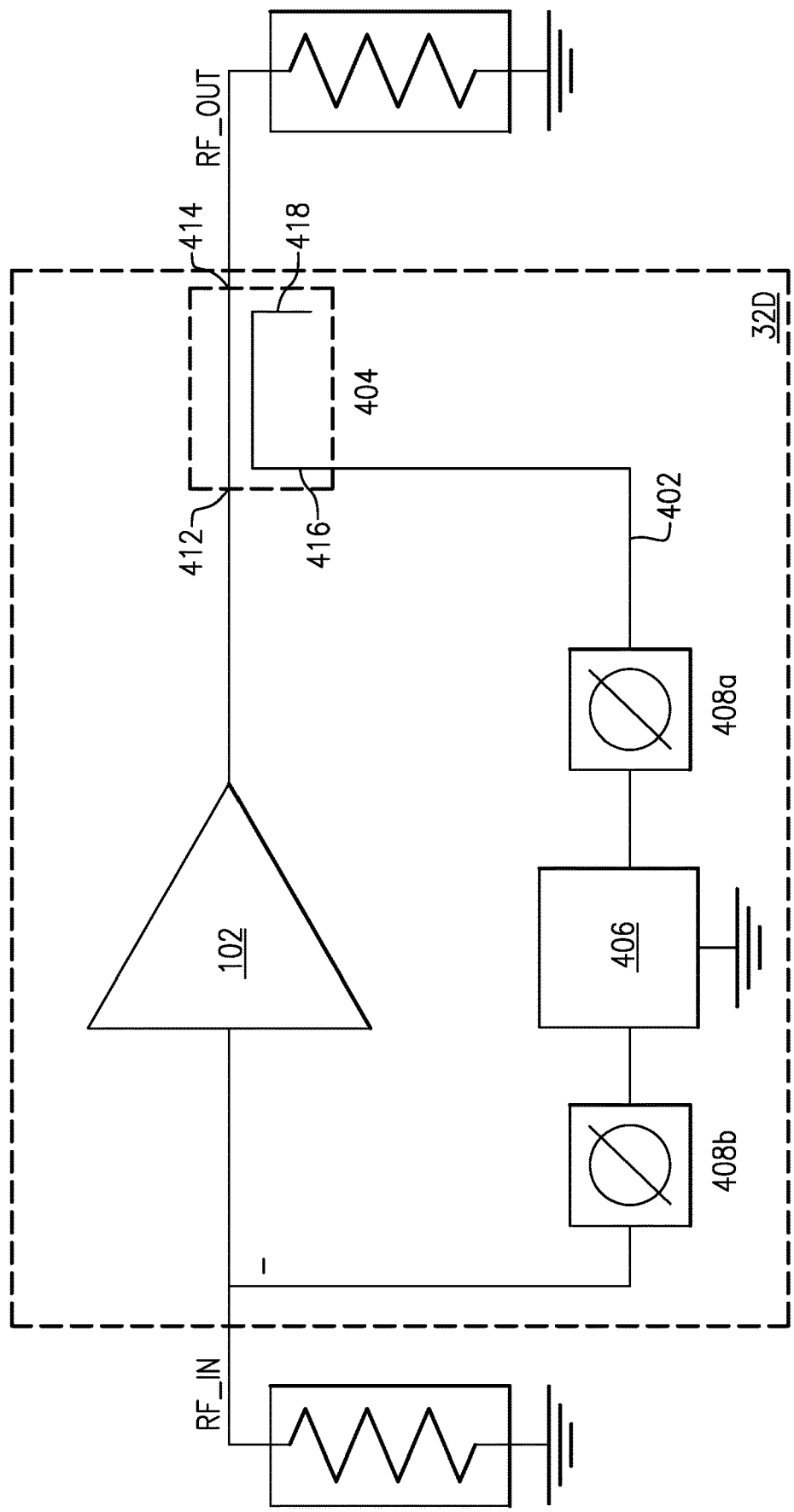

FIG. 4D is a schematic diagram of a feedback-arranged PA 32d for suppressing noise from undesired frequency bands, in accordance with some embodiments, the feedback-arranged PA 32d is similar to the feedback-arranged PA 32a illustrated in FIG. 4A, and further comprises both phase shifters 408a and 408b. In some embodiments, the phase shifter 408a may shift the signal from the directional coupler 404 by a first amount, while the phase shifter 408b may shift the output of the BPF 406 by a second amount. In some embodiments, the phase shifters 408a and 408b may be configured such that phase shifter 408b causes BPF 406 to present a high impedance to the input node of amplifier 102 in the desired frequency band. In some embodiments, the phase shifters 408a and 408b may be configured such that the cascaded phase shifts of amplifier 102, coupler 404, phase shifter 408a, BPF 406, and phase shifter 408b sum up to 180 degrees in the undesired frequency band. In some embodiments, the phase shifters 408a and 408b may be configured to satisfy both of these conditions.

In some embodiments, the feedback loop 402 may comprise one or more additional components (not shown) configured to change a magnitude of the output signal of the directional coupler 404 and/or the BPF 406, thus changing a magnitude of the feedback at the input of the power amplifier 102.

As described, in the illustrated embodiment the output of the feedback path is directly connected to the RF_IN signal, and in such configurations the phase of the output of the feedback path and the RF_IN signal can be 180 degrees or approximately 180 degrees out of phase, resulting in cancellation of the feedback signal at the input of the amplifier 102. This can achieve a simplified design because a separate component is not used to couple the feedback path to the RF_IN signal. In some other implementations, the cancellation is achieved using a separate component. For instance, the output of the feedback path and the RF_IN signal can be configured as inputs to a 180 degree hybrid coupler, the output of which is connected to the input of the amplifier 102. In such an embodiment, the 180 degree hybrid coupler effectively acts as a summer, which applies a negative sign to one of the inputs. To achieve cancellation, the components in the feedback-arranged PA 32a would be selected in such an embodiment so that the output of the feedback path has the same phase or approximately the same phase as the RF_IN signal.

Figure 5:
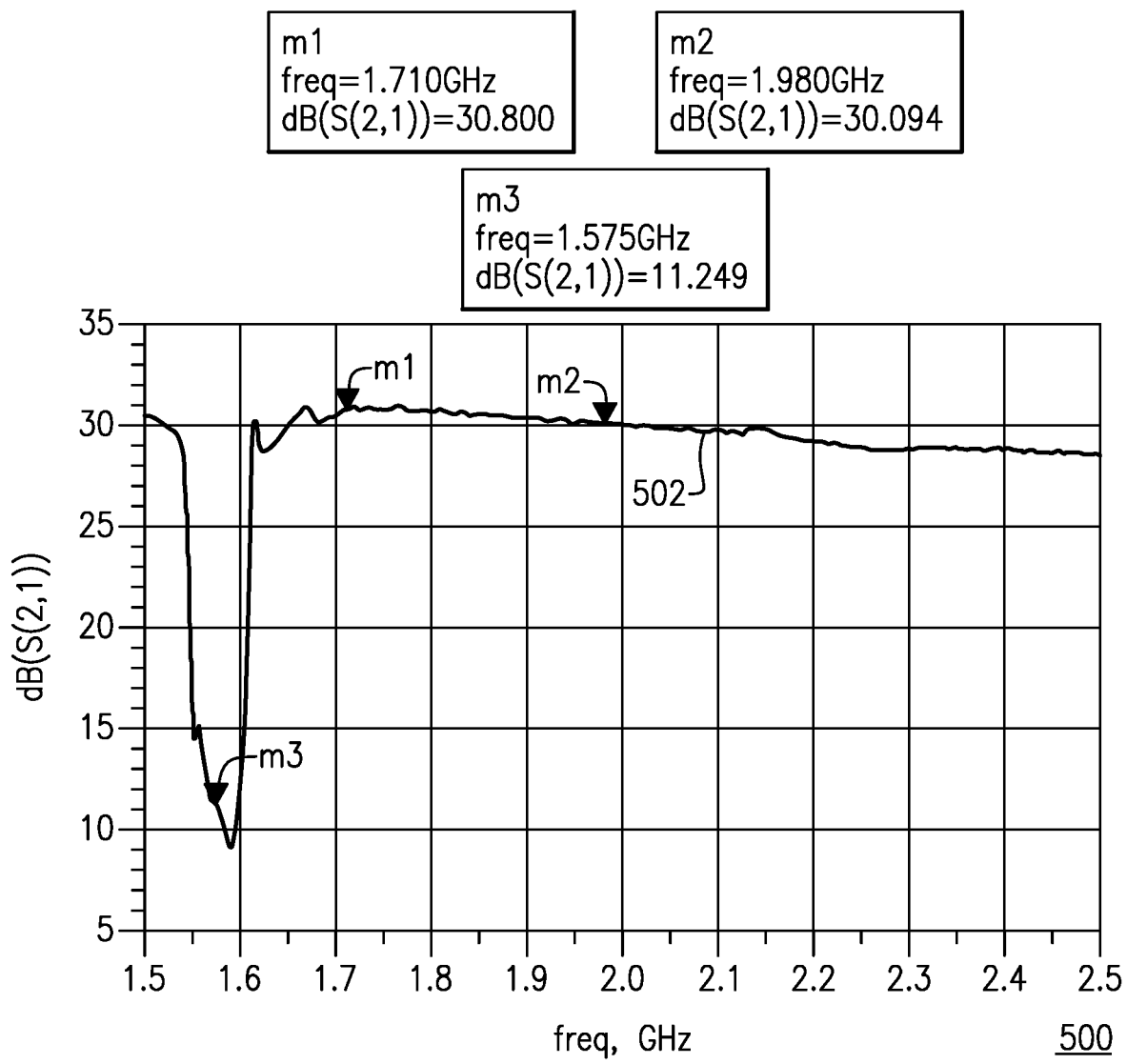
FIG. 5 is a graph showing a plot of the frequency response of the power gain of a power amplifier feedback system, in accordance with some embodiments.

FIG. 5 is a graph showing an output signal of a feedback-arranged PA, in accordance with some embodiments. As illustrated in FIG. 5, the graph 50 shows an x-axis corresponding to frequency (measured in GHz), and a y-axis corresponding to signal strength (measured in dB). The graph 500 contains a first curve 502 which plots the power gain of the feedback-arranged PA 32a over different frequencies.

For example, at most frequencies, such as at points m1 and m2 on the first curve 502, (which to frequencies of 1.710 GHz and 1.980 GHz respectively) the power gain of the feedback-arranged PA 32a may be approximately 30 dB. However, near the point m3 corresponding to a frequency of 1.575 GHz, which is within the undesired GPS frequency band, the gain may be greatly reduced in (~11.25 dB). Thus, as illustrated in the graph 500, the feedback loop 402 of the feedback-arranged PA containing the band pass filter 406 may function as a band reject filter, suppressing the signal at the undesired frequency band.

Figure 6:
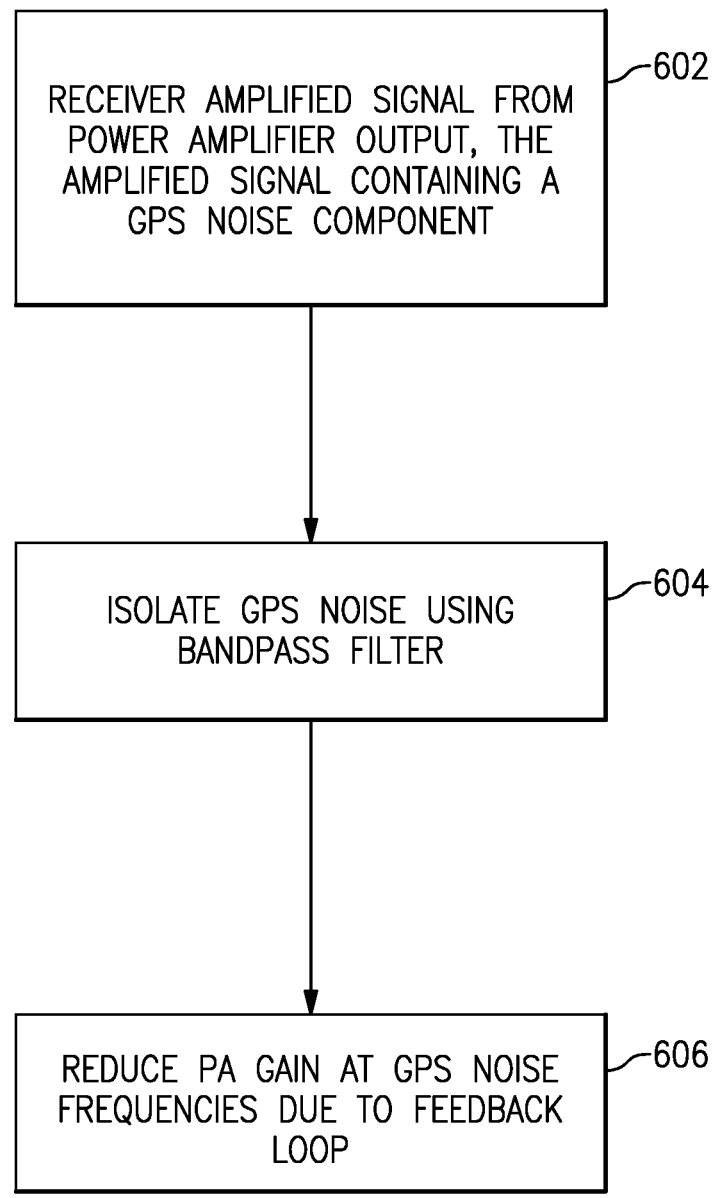
FIG. 6 is a flowchart of a process for using feedback to suppress noise in a PA feedback system, in accordance with some embodiments.

FIG. 6 is a flowchart of a process 600 for using feedback to suppress noise in a feedback-arranged PA, in accordance with some embodiments.

At block 602, the feedback loop 402 of a feedback-arranged PA receives an amplified signal from an output of a power amplifier (e.g., power amplifier 102), the amplified signal containing an undesired noise component associated with a particular undesired frequency range (e.g., a GPS noise component). In some embodiments, the amplified signal may be received by the feedback loop 402 through the directional coupler 404.

The system can also calibrate the feedback loop 402, before, during, or after receiving the amplified signal. For instance, the wireless device 11 may configure the phase shifter 408a, phase shifter 408b, coupler 404 and/or band pass filter 406, as applicable, in any of the manners described herein, such as with respect to FIGS. 4A-4D. For example, the processor 20 of the wireless device 11 (FIG. 2), processor 34 of the transceiver 33 (FIG. 3), or some other appropriate controller or other component of the wireless device 11 can drive one or more control inputs to the phase shifter 408a, phase shifter 408b, coupler 404, and/or band pass filter 406, as applicable. As one example, referring to FIG. 4D the wireless device can adjust the post-filter phase shifter 408b to achieve a desired impedance and adjust the pre-filter phase shifter 408a to minimize gain in the undesired band, as discussed herein.

At block 604, the feedback loop 402 isolates the noise component of the received amplified signal (e.g., GPS noise). In some embodiments, the noise component is isolated using a band pass filter (e.g., BPF 406) configured to pass through the undesired frequency range and suppress signals outside the undesired frequency range. In some embodiments, the feedback loop 402 may comprise one or more phase shifters to shift the phase of the received amplified signal or the output of the BPF 406. In some embodiments, the one or more phase shifters may be configured such that the phase of a shifted output of the BPF 406 aligns with a phase of an input signal of the power amplifier.

At block 606, the feedback loop 402 reduces the gain of the power amplifier at frequencies corresponding to the noise component. For example, in some embodiments, the output of the feedback loop 402 may correspond to noise component received from the output of the power amplifier. By feeding the noise component signal back to the input of the power amplifier, overall gain by the power amplifier at the undesired frequency band associated with the noise may be reduced.

As discussed above, use of a bandpass filter and feedback loop may allow for noise associated with protected frequency bands to be reduced in power amplifier circuits. In addition, because the bandpass filter is located along a feedback loop instead of directly receiving the output of the power amplifier, the required power capacity of the bandpass filter may be reduced in comparison to if a band rejection filter is used. In some embodiments, an existing commercial bandpass filter may be used to achieve a similar band rejection function as a specially designed band rejection filter. An advantageous feature of this arrangement is that it can avoid the placement of a notch filter in cascade with the PA output, and thereby avoid the passband insertion loss of a such a cascaded filter, which could be 2 dB or more, resulting in loss of as much as 40% of the PA's output power. Here in this arrangement the only component placed at the PA output is the coupler which causes a loss of only about 1% of the PA's output power. Therefore the entire system can provide much better power efficiency, and can draw less power from its power supply compared to a system with conventional cascaded notch filter.

Although the illustrated embodiments show a feedback-arranged PA having one feedback loop 402, in some embodiments multiple feedback loops may be used. For example, in some embodiments, each of a plurality of feedback loops may contain a BPF configured to pass a different frequency band, allowing for the feedback-arranged PA to suppress noise associated with multiple different frequency bands.

Some of the embodiments described above have provided examples in connection with wireless devices or mobile phones. However, the principles and advantages of the embodiments can be used for any other systems or apparatus that have needs for power amplifier circuits.

Such power amplifier circuits can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a power amplifier configured to receive both a radio frequency signal associated with a first frequency band and noise associated with a second frequency band, to provide amplification to both the radio frequency signal associated with the first frequency band and the noise associated with the second frequency band, and to output an amplified radio frequency signal including the amplified radio frequency signal and the amplified noise; and
an acoustic wave bandpass filter arranged in a negative feedback configuration with respect to the power amplifier, the acoustic wave bandpass filter configured to pass through the amplified noise corresponding to the second frequency band to an input of the power amplifier to provide negative feedback to the power amplifier, resulting in a reduction in an amount of gain from the power amplifier within the second frequency band.

2. The power amplifier system of claim 1 wherein the first frequency band corresponds to a Long-Term Evolution mid-band frequency band.

3. The power amplifier system of claim 1 wherein the acoustic wave bandpass filter is a surface acoustic wave filter or a bulk acoustic wave filter.

4. The power amplifier system of claim 1 wherein the second frequency band corresponds to a global positioning system frequency band.

5. The power amplifier system of claim 1 further comprising a directional coupler positioned between an output of the power amplifier and an input of the acoustic wave bandpass filter.

6. The power amplifier system of claim 1 further comprising at least one phase shifter coupled between an output of the power amplifier and an input of the acoustic wave bandpass filter.

7. The power amplifier system of claim 1 further comprising at least one phase shifter coupled between the output of the acoustic wave bandpass filter and an input of the power amplifier.

8. A wireless device comprising:
a transceiver configured to generate a radio frequency signal associated with a first frequency band;
a power amplifier configured to receive both the radio frequency signal and noise associated with a second frequency band, and to provide amplification to both the radio frequency signal and the noise, and to output an amplified radio frequency signal including the amplified radio frequency signal and the amplified noise; and
an acoustic wave bandpass filter arranged in a feedback configuration with respect to the power amplifier, the acoustic wave bandpass filter configured to pass through the amplified noise corresponding to the second frequency band to an input of the power amplifier to provide negative feedback to the power amplifier, resulting in a reduction in an amount of gain from the power amplifier within the second frequency band.

9. The wireless device of claim 8 wherein the first frequency band corresponds to a Long-Term Evolution mid-band frequency band.

10. The wireless device of claim 8 wherein the acoustic wave bandpass filter is a surface acoustic wave filter or a bulk acoustic wave filter.

11. The wireless device of claim 8 wherein the second frequency band corresponds to a global positioning system frequency band.

12. The wireless device of claim 8 further comprising a directional coupler positioned between an output of the power amplifier and an input of the acoustic wave bandpass filter.

13. The wireless device of claim 8 further comprising at least one phase shifter coupled between an output of the power amplifier and an input of the acoustic wave bandpass filter.

14. The wireless device of claim 8 further comprising at least one phase shifter coupled between the output of the acoustic wave bandpass filter and an input of the power amplifier.

15. A radio frequency module comprising:
a substrate;
a power amplifier supported by the substrate and configured to receive both a radio frequency signal associated with a first frequency band and noise associated with a second frequency band, to provide amplification to both the radio frequency signal associated with the first frequency band and the noise associated with the second frequency band, and to output an amplified radio frequency signal including the amplified radio frequency signal and the amplified noise; and
an acoustic wave bandpass filter arranged in a feedback configuration with respect to the power amplifier, the acoustic wave bandpass filter configured to pass through the amplified noise corresponding to the second frequency band to an input of the power amplifier to provide negative feedback to the power amplifier, resulting in a reduction in an amount of gain from the power amplifier within the second frequency band.

16. The radio frequency module of claim 15 wherein the first frequency band corresponds to a Long-Term Evolution mid-band frequency band.

17. The radio frequency module of claim 15 wherein the acoustic wave bandpass filter is a surface acoustic wave filter or a bulk acoustic wave filter.

18. The radio frequency module of claim 15 wherein the second frequency band corresponds to a global positioning system frequency band.

19. The radio frequency module of claim 15 further comprising a directional coupler positioned between an output of the power amplifier and an input of the acoustic wave bandpass filter.

20. The radio frequency module of claim 15 further comprising at least one phase shifter coupled between an output of the power amplifier and an input of the acoustic wave bandpass filter.

21. The radio frequency module of claim 15 further comprising at least one phase shifter coupled between the output of the acoustic wave bandpass filter and an input of the power amplifier.

* * * * *